(12) United States Patent
Mori

(10) Patent No.: US 7,406,145 B2
(45) Date of Patent: Jul. 29, 2008

(54) JITTER DETECTION CIRCUIT

(75) Inventor: Tadayoshi Mori, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 526 days.

(21) Appl. No.: 11/080,568

(22) Filed: Mar. 16, 2005

(65) Prior Publication Data

US 2005/0207523 A1 Sep. 22, 2005

(30) Foreign Application Priority Data

Mar. 19, 2004 (JP) .............................. 2004-081726

(51) Int. Cl.
*H03D 3/24* (2006.01)

(52) U.S. Cl. ...................................... 375/376

(58) Field of Classification Search ................ 375/226, 375/327, 376, 215, 294; 370/516, 503; 702/69; 348/497; 342/103; 455/180.3, 266

See application file for complete search history.

(56) References Cited

U.S. PATENT DOCUMENTS 6,466,058 B1 * 10/2002 Goldman ..................... 327/49

FOREIGN PATENT DOCUMENTS

JP 2001-346127 12/2001

* cited by examiner

*Primary Examiner*—Sam K Ahn
(74) *Attorney, Agent, or Firm*—Young & Thompson

(57) ABSTRACT

There is provided a jitter detection circuit of a phase locked loop circuit, comprising a comparison circuit. The comparison circuit compares an input clock that is inputted to the phase locked loop circuit and an output clock that is outputted by the phase locked loop circuit. When it is determined that the frequency difference between the input clock and the output clock is outside a predetermined range, the comparison circuit outputs a first anomaly signal. The comparison circuit is constituted as a digital circuit.

8 Claims, 11 Drawing Sheets ent invention.

JITTER DETECTION CIRCUIT

BACKGROUND OF THE INVENTION

1. Field of the Invention

The present invention relates to a jitter detection circuit of a phase locked loop circuit (PLL circuit).

2. Description of the Related Art

A PLL circuit is integrated in a variety of devices, systems, and so forth and is employed in order to generate clocks for same. In Japanese Unexamined Patent Publication No. 2001-346127, a PLL circuit is integrated in a circuit that converts the aspect ratio of a picture signal and generates a sampling clock.

A jitter component is normally contained in a clock generated by a PLL circuit. When the jitter component exceeds a permissible value, it impedes normal operation of the device, system or the like in which the PLL circuit is integrated. Therefore, a circuit which detects the magnitude of the jitter contained in the clock generated by the PLL circuit exceeds the permissible value and outputs the detection result is very useful.

One example of the jitter detection circuit is shown in FIG. 11, for example, though the circuit does not constitute the Prior Art. In the jitter detection circuit, the phase difference between the input clock and the output clock is smoothed by a low pass filter (LPF) 110. The phase difference, which is analog value, is compared by using an analog comparator 120. Thus, the jitter detection circuit detects that the jitter contained in the output clock exceeds the permissible value. Specifically, the PLL circuit 100 comprises a phase comparator 102, LPF 104, a voltage controlled oscillator (VCO) 106 and divider 108. The output of the phase comparator 102 is inputted to an LPF 110.

However, the circuit in FIG. 11 is not capable of measuring the phase difference accurately and there is therefore the problem that the jitter detection accuracy is low. That is, an error occurs in the output of the phase comparator 102 and the threshold value voltage of the analog comparator 120 due to fluctuation in manufacture. This impedes achieving high accuracy in the jitter detection.

SUMMARY OF THE INVENTION

According to one aspect of the present invention, there is provided a jitter detection circuit of a phase locked loop circuit, comprising a comparison circuit that compares an input clock that is inputted to the phase locked loop circuit and an output clock that is outputted by the phase locked loop circuit and which, when it is determined that the frequency difference between the input clock and the output clock is outside a predetermined range, outputs a first anomaly signal that outputs an anomaly, wherein the comparison circuit is constituted as a digital circuit.

According to another aspect of the present invention, there is provided a jitter detection circuit for detecting the jitter of a phase locked loop circuit, wherein an input clock that is inputted to the phase locked loop circuit and an output clock that is outputted by the phase locked loop circuit are inputted and an anomaly is determined to have occurred when the frequency difference between the inputted input clock and output clock is outside a predetermined range on the basis of the input clock and output clock.

The jitter detection circuit outputs a first anomaly signal when the frequency difference between the input clock and output clock is outside a predetermined range. As a result of this anomaly signal, the user is able to acknowledge that the jitter contained in the output clock has increased in excess of a permissible value. Further, a comparison circuit is constituted as a digital circuit and, therefore, the above comparison and determination can be performed highly accurately.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

Figure 1:
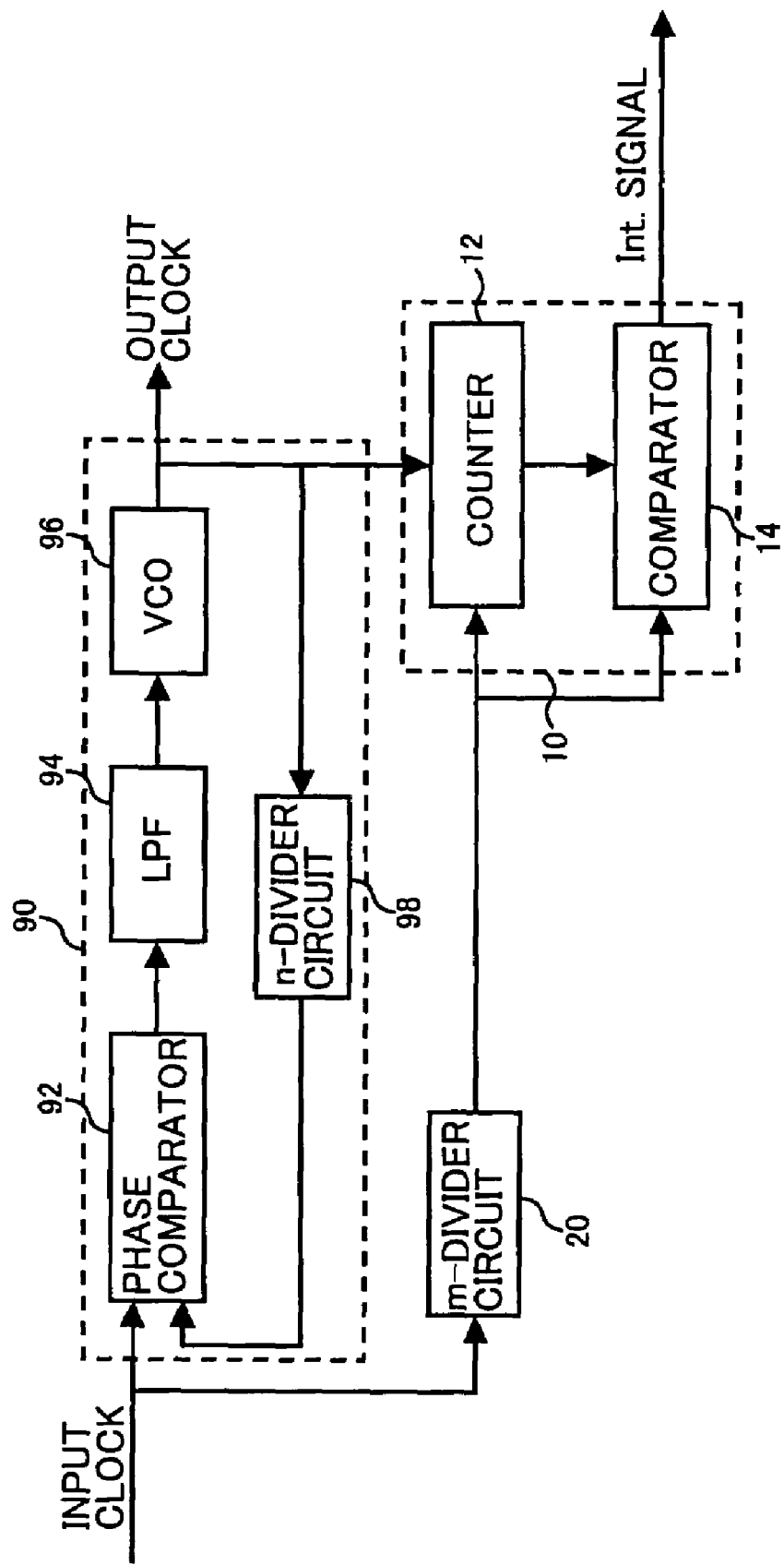
FIG. 1 is a block diagram showing a first embodiment of the jitter detection circuit of the phase locked loop circuit of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferred embodiments of the jitter detection circuit of the phase locked loop circuit of the present invention will be described in detail hereinbelow with reference to the drawings. Further, in the description of the drawings, the same reference numerals have been assigned to the same elements and therefore repetitive description will be omitted.

First Embodiment

FIG. 1 is a block diagram showing a first embodiment of the jitter detection circuit of the phase locked loop circuit of the present invention. The jitter detection circuit of this embodiment detects jitter contained in an output clock that is outputted by a PLL circuit 90 and comprises a comparison circuit 10 and an m divider circuit 20. The PLL circuit 90 comprises a phase comparator 92, an LPF 94, a VCO 96, and an n divider circuit 98.

The comparison circuit 10 is constituted as a digital circuit and comprises a counter 12 and a comparator 14. The comparison circuit 10 compares the input clock inputted to the PLL circuit 90 and the output clock outputted by the PLL circuit 90. When the comparison circuit 10 determines that the frequency difference between the two clocks is outside a predetermined range, the comparison circuit 10 outputs an Int. signal (first anomaly signal) to output an anomaly. More specifically, the comparison circuit 10 counts the number of pulses of the output clock in a reference time corresponding to m-multiplied cycle (m is a natural number) of the input clock and performs the above determination based on the count value.

The counter 12 receives the input clock via the m divider circuit 20 and the output clock. The counter 12 counts the number of pulses of the output clock. Here, the counter 12 resets the count value each time the input clock is inputted via the m devider circuit 20. The m divider circuit 20 fulfills the function of multiplying the cycle of the input clock by m. The value of m is suitably set. However, in cases where m=1, it is not necessary to provide the m divider circuit 20 and the input clock may be inputted directly to the counter 12.

Upon the receipt of the input clock from the m divider circuit 20, the comparator 14 latches the count value of the counter 12 and outputs the Int. signal if the count value is outside a predetermined range.

An example of the operation of the jitter detection circuit of the first embodiment will be described next. In this example, a countdown counter is used for counter 12. The initial value of the counter (the count value is reset to this value) is n*m and the counter 12 counts down from this value. The value of m is set at an optimum value by considering the permissible error of the output clock and the measurement interval and so forth of the output clock. The comparator 14 determines that the frequency difference between the input clock and output clock is outside the predetermined range when the count value is outside a range equal to or more than −2 and equal to or less than +2. Optimum values are also set for this range by considering the measurement error and so forth similarly to the value of m.

Figure 2:
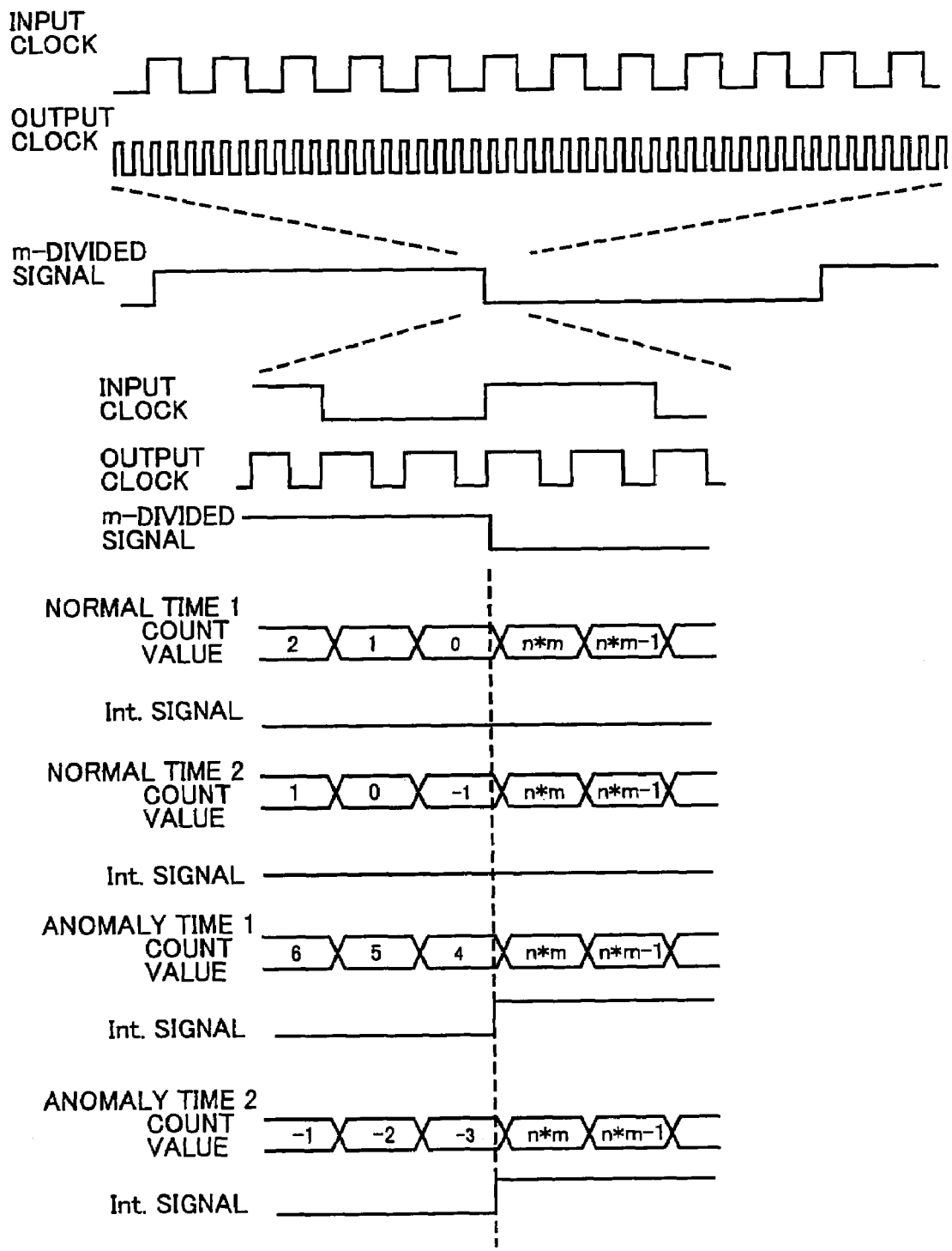
FIG. 2 is a time chart to illustrate an example of the operation of the jitter detection circuit of FIG. 1.

FIG. 2 represents a case where the comparator 14 determines that the count value of the counter 12 is within the above range at normal time 1 and normal time 2. Therefore, in these cases, the Int. signal is not outputted. At normal time 2, the frequency of the output clock is slightly higher than the desired value. On the other hand, since it is determined that the count value is outside the above range in the cases of anomaly time 1 and anomaly time 2, the Int. signal is outputted. Here, the frequency of the output clock is lower than the above range at anomaly time 1 and the frequency of the output clock is higher than the above range at anomaly condition 2.

The effect of the jitter detection circuit of the first embodiment will be described next.

The jitter detection circuit outputs the Int. signal when the frequency difference between the input clock and output clock is determined by the comparison circuit 10 to be outside the predetermined range. The user is able to acknowledge from the Int. signal that the jitter contained in the output clock has increased in excess of the permissible value. Further, since the comparison circuit 10 is constituted as a digital circuit, the comparison circuit 10 is different from the circuit in FIG. 11 that is constituted as an analog circuit and is able to perform the above comparison and determination highly accurately.

That is, a constant cycle generated by the m divider circuit 20 is generated based on the input clock. Thus, a constant reference time can be generated with the accuracy of the input clock. When the output clock from the PLL circuit 90 is divided by the counter 12 to generate a signal which has the same cycle as the constant reference time, such signal can ideally be generated. However, since a jitter component is contained in the output from the PLL circuit 90, it is difficult to generate the signal which has the same cycle as the constant reference time. This time difference constitutes the accumulation of the jitter component of the output clock from the PLL circuit 90. Therefore, by determining the cumulative value of the jitter component in a constant time by the comparator 14, it is possible to determine that the jitter in the output clock from the PLL circuit 90 exceeds the predetermined range.

Figure 11:
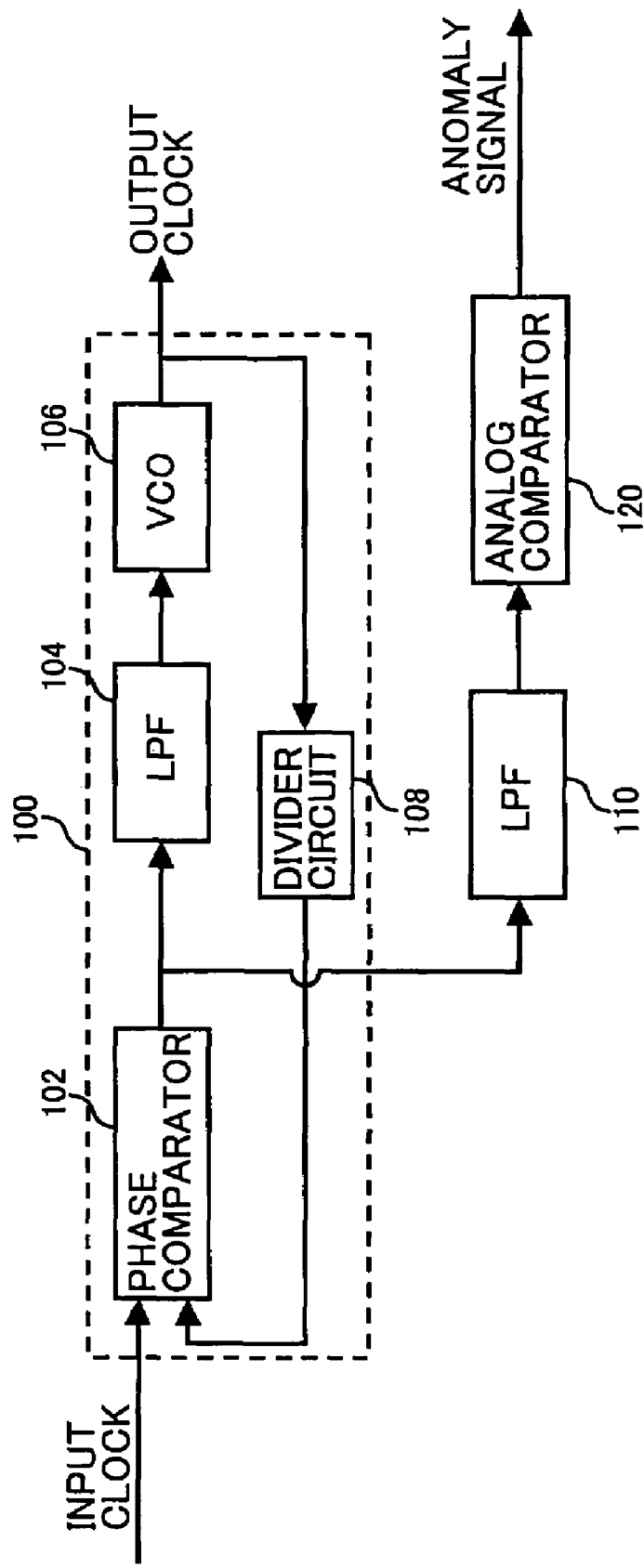
FIG. 11 is a block diagram to illustrate a jitter detection circuit according to a comparative example.

The circuit of FIG. 11 is only capable of detecting the phase difference and is unable to determine the cause of the phase difference. On the other hand, the jitter detection circuit of this embodiment is capable of determine the cause of the frequency difference between the input clock and the output clock. For example, in the case where the count value is not reset and the count number of the counter 12 is equal to or more than a predetermined number, it can be determined that the input clock is stopped or the output clock frequency is abnormally high. Further, it can be determined that the output clock is stopped when the count value has not changed once in the reference time.

The comparison circuit 10 counts the number of pulses of the output clock in the reference time that is generated by multiplying the cycle of the input clock by m and performs the above comparison and determination on the basis of the count value. As a result, the comparison circuit 10 can be easily constituted as a digital circuit. Further, although a down counter is used in the above operation example, an up counter may be used instead of the down counter.

The comparison circuit 10 comprises a counter 12 that counts the number of pulses of the output clock. The counter 12 resets the count value when the input clock is inputted directly or via the m divider circuit 20 to the counter 12. As a result, it is possible to count the number of pulses of the output clock in the reference time particularly accurately.

Second Embodiment

Figure 3:
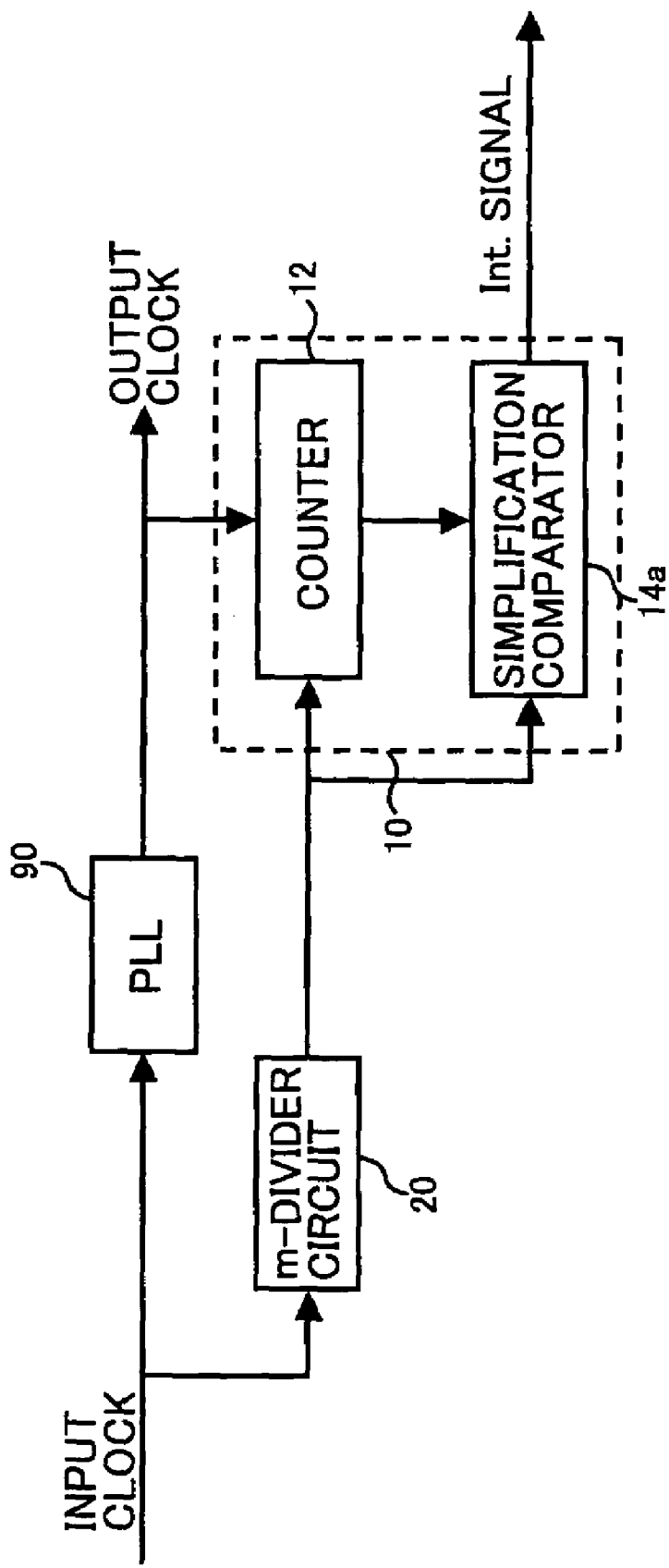
FIG. 3 is a block diagram showing a second embodiment of the jitter detection circuit of the phase locked loop circuit of the present invention.

FIG. 3 is a block diagram showing a second embodiment of the jitter detection circuit of the phase locked loop circuit of the present invention. In this embodiment, a simplification comparator 14a is provided instead of the comparator 14 of FIG. 1. The remaining constitution is the same as that of the circuit shown FIG. 1. The simplification comparator 14a determines whether the count value is within a predetermined range on the basis of only some of the bits among a plurality of bits representing the count value of the counter 12.

An example of the operation of the simplification comparator 14a will be provided next. In this example, a down counter is used as the counter 12 and the simplification comparator 14a determines the count value to be normal when the count value is within a range equal to or more than −4 and equal to or less than +3.

Here, the simplification comparator 14a performs the above determination based on only a combination of an underflow value of the counter 12 and one bit of the count value. That is, the simplification comparator 14a determines the count value to be normal when (i) the underflow value is zero and the value of the third bit from the LSB (least significant bit) of the count value is 0 and (ii) when the underflow value is one and the value of the third bit from the LSB of the count value is 1. Therefore, in Table 1, 0011, 0010, 0001, and 0000 in the left-hand fields and 1111, 1110, 1101 and 1100 in the right-hand fields are determined as normal. Here, the underflow value is reset at the same time as the count value is reset.

Further, in this case, values for the possibility of an erroneous determination are periodically generated. In Table 1, 1011, 1010, 1001, and 1000 in the left-hand fields and 0111, 0110, 0101 and 0100 in the right-hand fields correspond to such values. However, the jitter detection circuit according to this embodiment can detect most problems including the case where significant abnormality and instability occur, and the case where the deviation is slightly large. In the case where a regular offset is generated and in the case where an unexpected error is determined in the event of a significant abnormality, the jitter detection circuit according to this embodiment can not detect these problems. However, in the latter case, the jitter detection circuit is likely to detect the problem at the subsequent timing or the like.

TABLE 1

| underflow value | count value |
|---|---|
| 0 | 1111 |
| 0 | 1110 |
| 0 | 1101 |
| 0 | 1100 |
| 0 | 1011 |
| 0 | 1010 |
| 0 | 1001 |
| 0 | 1000 |
| 0 | 0111 |
| 0 | 0110 |
| 0 | 0101 |
| 0 | 0100 |
| 0 | 0011 |
| 0 | 0010 |
| 0 | 0001 |
| 0 | 0000 |
| 1 | 1111 |
| 1 | 1110 |
| 1 | 1101 |
| 1 | 1100 |
| 1 | 1011 |
| 1 | 1010 |
| 1 | 1001 |
| 1 | 1000 |
| 1 | 0111 |
| 1 | 0110 |
| 1 | 0101 |
| 1 | 0100 |
| 1 | 0011 |
| 1 | 0010 |
| 1 | 0001 |
| 1 | 0000 |

The effect of the jitter detection circuit of the second embodiment will be described next. This jitter detection circuit also outputs the Int. signal when the frequency difference between the input clock and output clock is determined by the comparison circuit 10 to be outside a predetermined range and, therefore, the user is able to acknowledge that the jitter contained in the output clock has increased in excess of the permissible value. Further, the comparison circuit 10 is constituted as a digital circuit and, hence, is able to perform the above comparison and determination highly accurately.

In addition, the count value is expressed by using a plurality of bits and the simplification comparator 14a performs a determination on the basis of only some of the bits among a plurality of bits. As a result, the circuit constitution of the comparison circuit 10 can be simplified.

Third Embodiment

Figure 4:
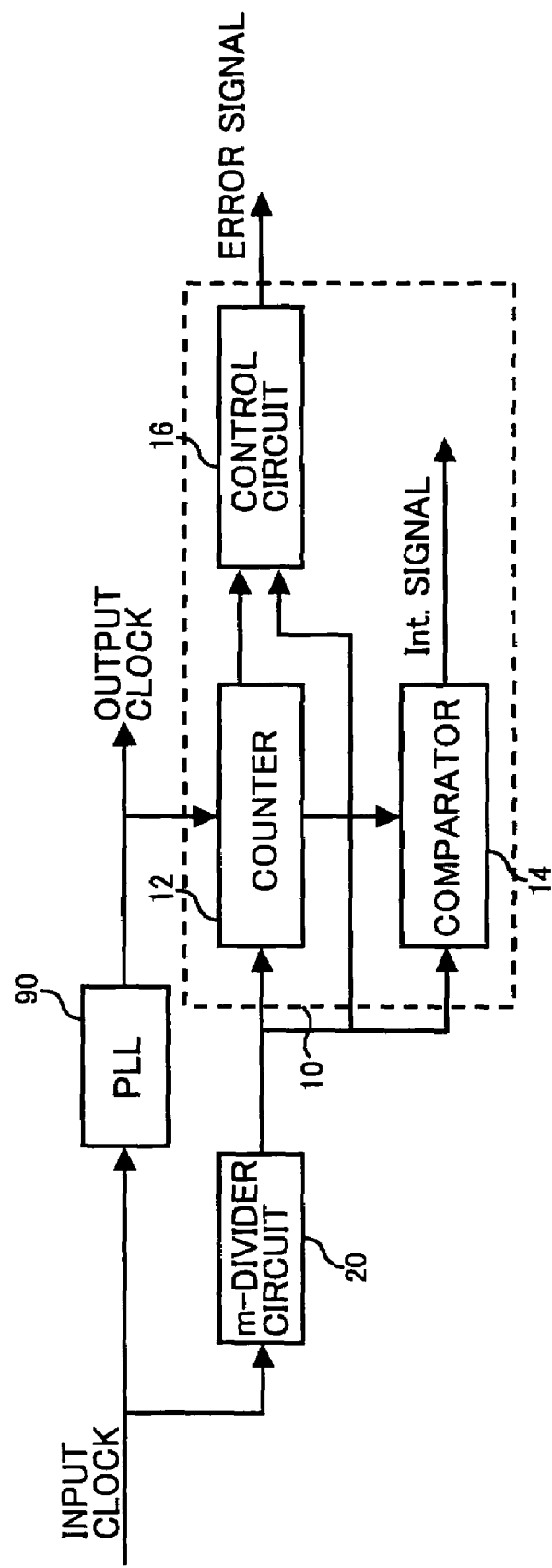
FIG. 4 is a block diagram showing a third embodiment of the jitter detection circuit of the phase locked loop circuit of the present invention.

FIG. 4 is a block diagram showing the third embodiment of the jitter detection circuit of the phase locked loop circuit of the present invention. In this embodiment, the comparison circuit 10 comprises a counter 12, a comparator 14, and a control circuit 16. The counter 12 and comparator 14 are the same as those elements shown in FIG. 1. The control circuit 16 outputs an error signal (second anomaly signal) to inform an anomaly when the count number of the counter 12 is equal to or more than a predetermined value without resetting the count value of the counter 12.

Figure 5:
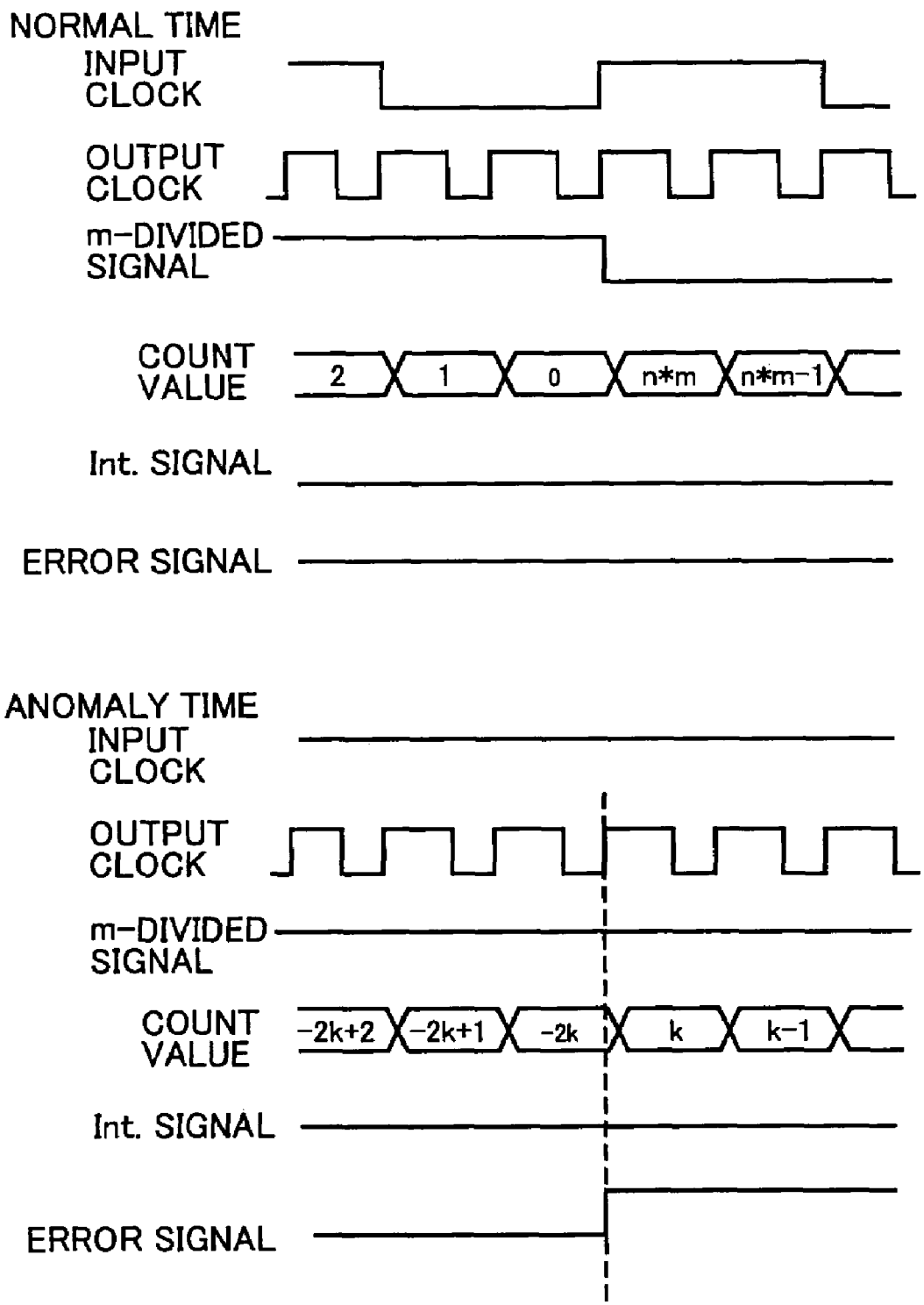
FIG. 5 is a time chart to illustrate an example of the operation of the jitter detection circuit of FIG. 4.

FIG. 5 illustrates an example of time charts for a normal time and an anomaly time. The anomaly time includes a case where the input clock is stopped. In FIG. 5, k=n*m. In this example, the initial value of the count value is k and an error signal is outputted at the time when the count value has reached −2 k in the countdown. That is, the control circuit 16 is set to output the error signal when the count number is equal to or more than 3 k.

The jitter detection circuit with the above configuration also outputs the Int. signal when the frequency difference between the input clock and output clock is determined by the comparison circuit 10 to be outside a predetermined range and, hence, the user is able to acknowledge that the jitter contained in the output clock has increased in excess of the permissible value. Further, since the comparison circuit 10 is constituted as a digital circuit, the comparison circuit 10 is able to perform the above comparison and determination highly accurately.

In addition, the control circuit 16 outputs an error signal when the count number of the counter 12 is equal to or more than a predetermined value without resetting the count value. As a result, it is possible to detect that the input clock is stopped or that the output clock frequency is extremely high.

Further, the output frequency of the PLL circuit 90 is principally dependent on the oscillation frequency of the VCO 96. The oscillation frequency of the VCO 96 has the upper limit determined by the circuit constant. Therefore, for an extremely high frequency, it can be detected that the input clock is stopped when the output frequency is higher than the upper limit value.

Fourth Embodiment

Figure 6:
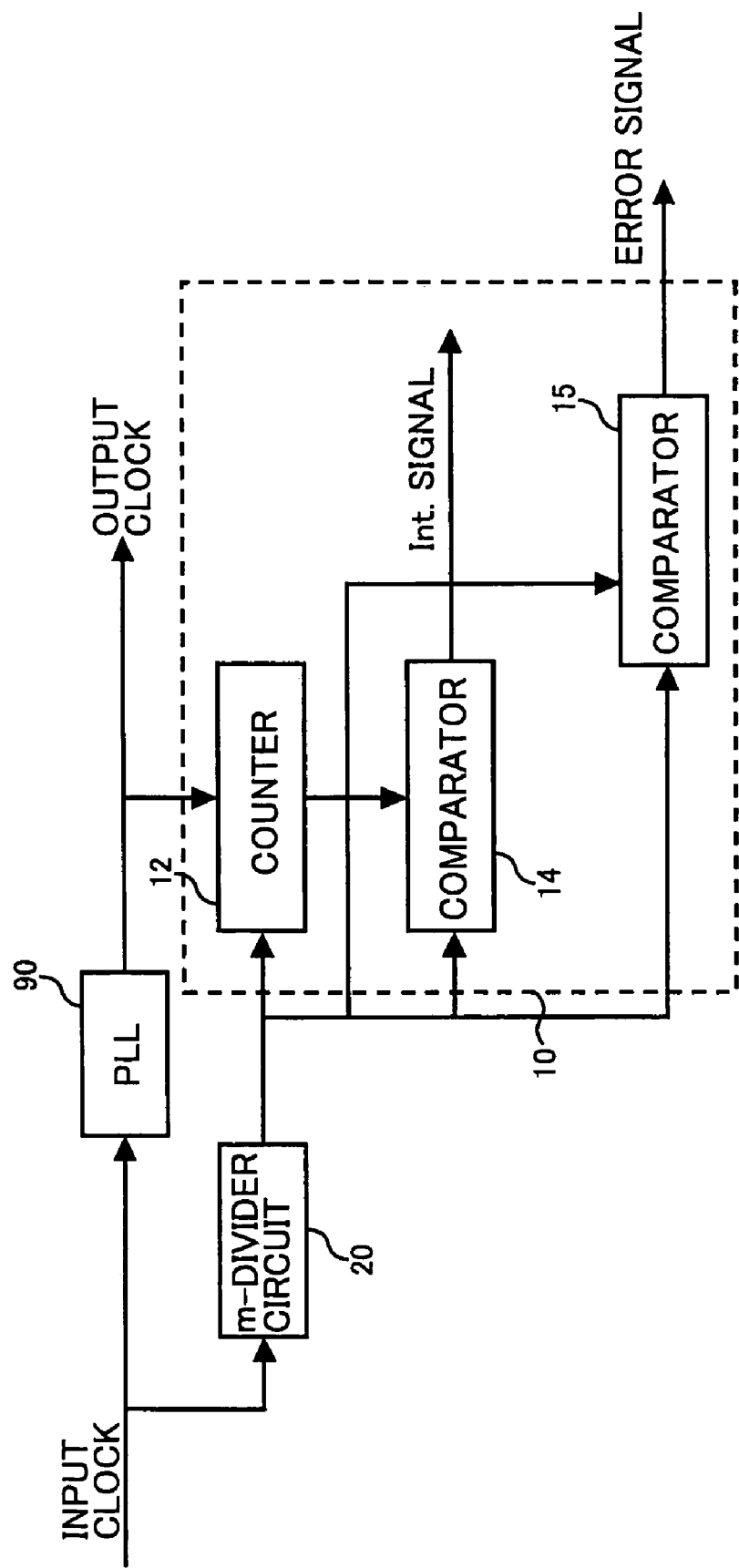
FIG. 6 is a block diagram showing a fourth embodiment of the jitter detection circuit of the phase locked loop circuit of the present invention.
Figure 7:
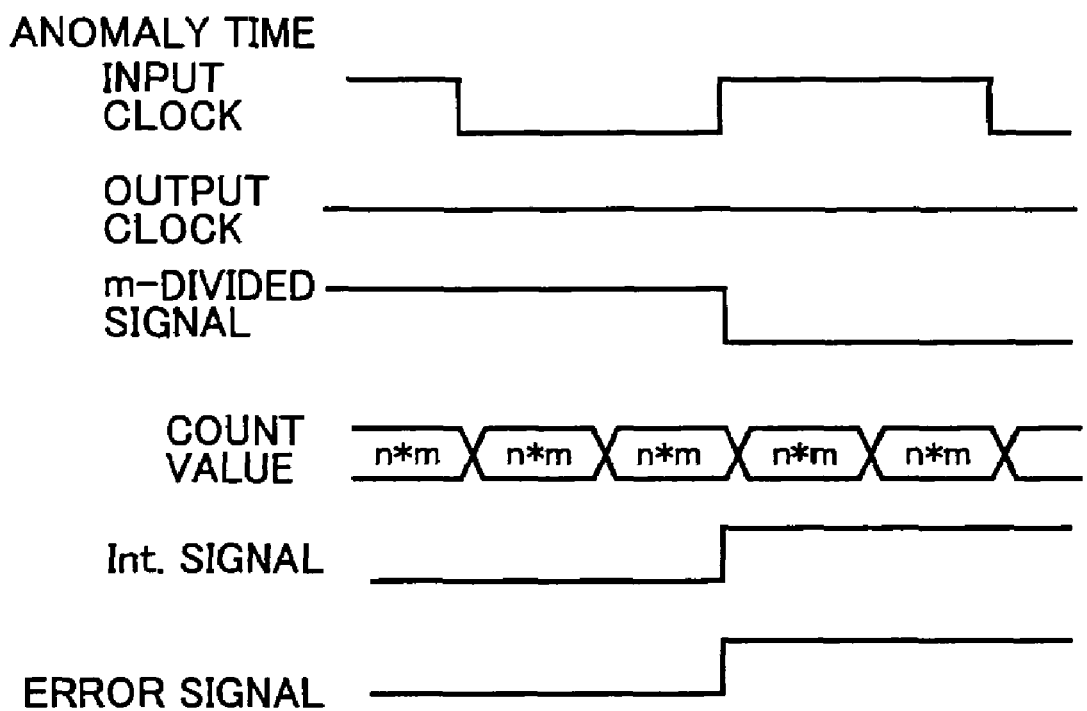
FIG. 7 is a time chart to illustrate an example of the operation of the jitter detection circuit of FIG. 6.

FIG. 6 is a block diagram showing a fourth embodiment of the jitter detection circuit of the phase locked loop circuit of the present invention. In this embodiment, the comparison circuit 10 comprises a counter 12, comparator 14 and comparator 15. The comparator 15 outputs an error signal (third anomaly signal) that informs an anomaly when the count value of the counter 12 has not changed once in the reference time. FIG. 7 shows an example of a time chart at an anomaly time. The anomaly time in FIG. 7 is a case where the output clock is stopped.

The jitter detection circuit with the above configuration also outputs the Int. signal when the frequency difference between the input clock and output clock is determined by the comparison circuit 10 to be outside a predetermined range and, therefore, the user is able to acknowledge that the jitter contained in the output clock has increased in excess of a permissible value. Further, the comparison circuit 10 is capable of performing the above comparison and determination highly accurately since the comparison circuit 10 is constituted as a digital circuit.

In addition, the comparator 15 outputs an error signal when the count value has not changed once in the reference time. As a result, it is possible to detect that the output clock is stopped.

Fifth Embodiment

Figure 8:
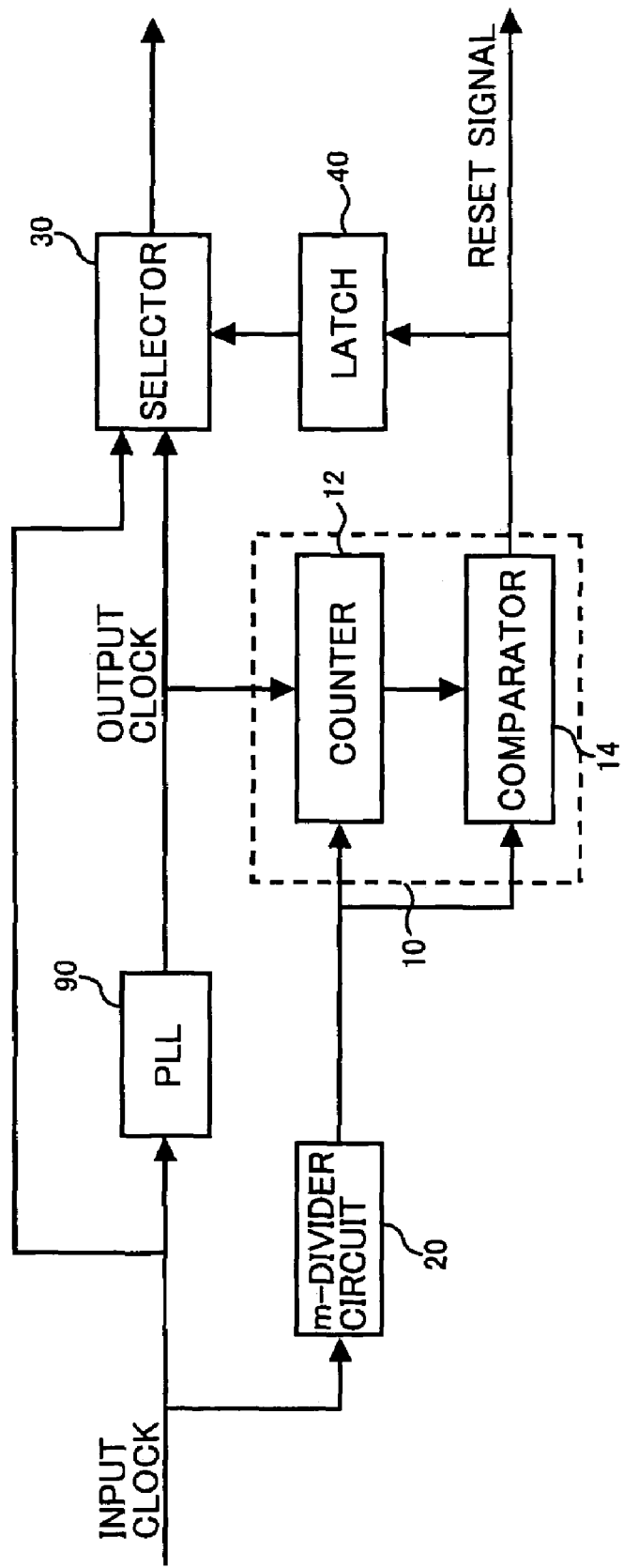
FIG. 8 is a block diagram showing a fifth embodiment of the jitter detection circuit of the phase locked loop circuit of the present invention.

FIG. 8 is a block diagram showing a fifth embodiment of the jitter detection circuit of the phase locked loop circuit of the present invention. The jitter detection circuit of this embodiment comprises a comparison circuit 10, m divider circuit 20, selector 30 and latch 40. The comparison circuit 10 and m divider circuit 20 are the same as those shown in FIG. 1. The selector 30 is a switching circuit which receives a plurality of clocks including the output clock from the PLL circuit 90 and outputs any one clock among these clocks. In this embodiment, the selector 30 divides the input clocks and outputs them to the PLL circuit 90 as clocks excluding the output clock from the PLL circuit 90.

In the jitter detection circuit, the selector 30 selects and outputs the output clock from the PLL circuit 90 at a normal time. On the other hand, at an anomaly time, that is, when the comparator 14 has determined that the frequency difference between the input clock and output clock is outside a predetermined range, the selector 30 selects and outputs the input clock. When the comparator 14 outputs an anomaly signal (a reset signal in FIG. 8), the latch 40 latches the state and outputs a command signal to switch the clock to the selector 30. As a result, the selector 30 switches the output clock from the PLL circuit 90 to the input clock and outputs same.

The jitter detection circuit with the above configuration also outputs the Int. signal when the frequency difference between the input clock and output clock is determined by the comparison circuit 10 to be outside a predetermined range and, hence, the user is able to acknowledge that the jitter contained in the output clock has increased in excess of the permissible value. Further, because the comparison circuit 10 is constituted as a digital circuit, the comparison circuit 10 is able to perform the above comparison and determination highly accurately.

In addition, since the selector 30 is provided in this embodiment, even in cases where an anomaly occurs with the output clock generated by the PLL circuit 90, a switch to a normal clock can be executed automatically.

Figure 9:
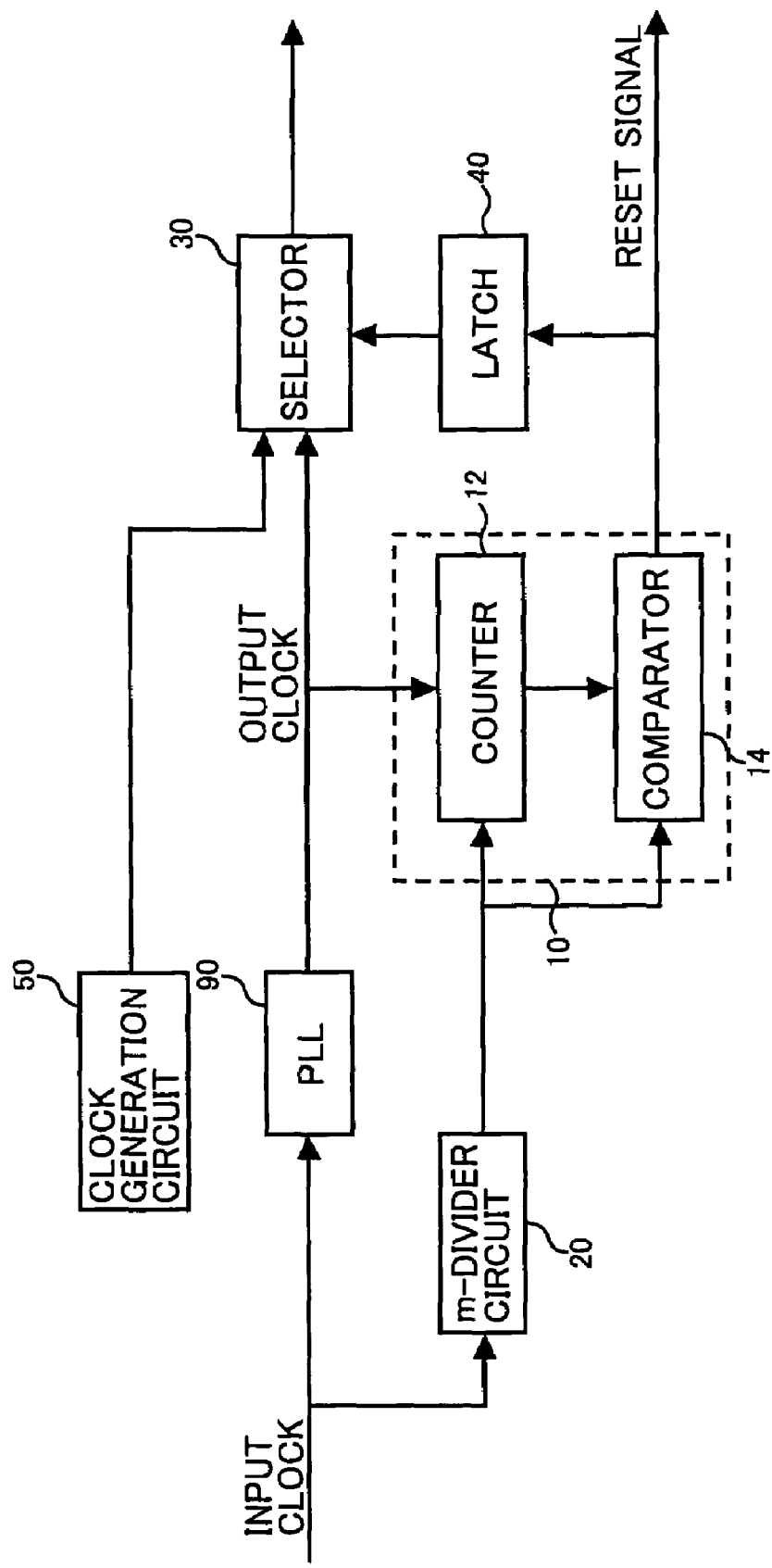
FIG. 9 is a block diagram to illustrate a modified example of the jitter detection circuit of FIG. 8.

Further, the selector 30 of this embodiment inputs the input clocks to the PLL circuit 90 as clocks excluding the output clock from the PLL circuit 90. However, other clocks may be inputted. For example, as shown in FIG. 9, the selector 30 may be constituted to input the output from another clock generation circuit 50.

Figure 10:
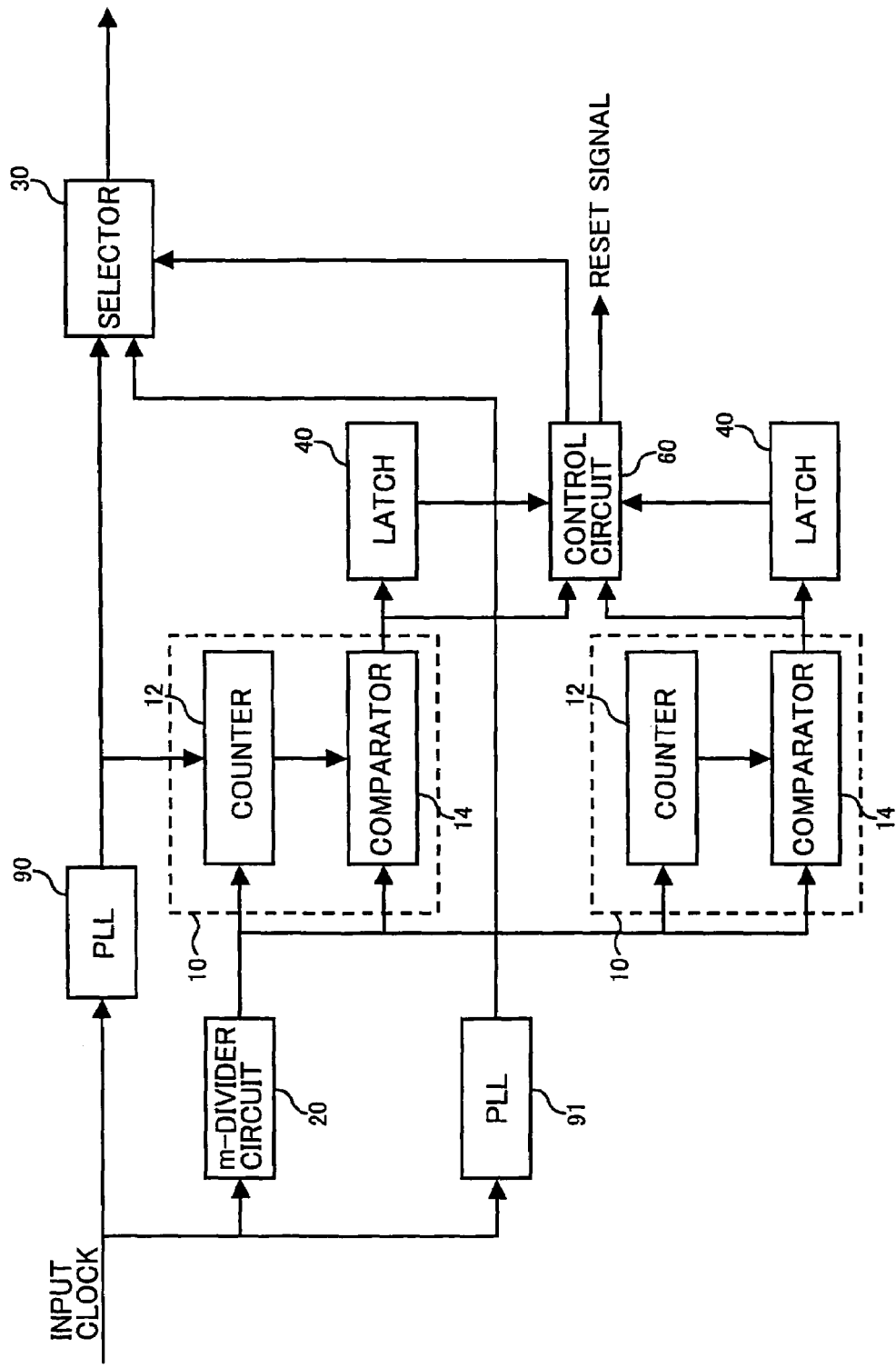
FIG. 10 is a block diagram to illustrate a modified example of the jitter detection circuit of FIG. 8.

Further, as shown in FIG. 10, the selector 30 may be constituted to input the output from a PLL circuit 91 that is separate from the PLL circuit 90. In FIG. 10, the PLL circuit 91 is also provided with the comparison circuit 10 and latch 40. In cases where there is an anomaly in the PLL circuit (PLL circuit 90 or PLL circuit 91) that outputs one clock that is selected by the selector 30 at the present time, the control circuit 60 transmits a command signal to the selector 30 to switch to the other PLL circuit.

It is apparent that the present invention is not limited to the above embodiment and it may be modified and changed without departing from the scope and spirit of the invention.

What is claimed is:

1. The jitter detection circuit of a phase locked loop circuit, comprising:
    a comparison circuit that compares an input clock that is inputted to the phase locked loop circuit and an output clock that is outputted by the phase locked loop circuit and which, when the frequency difference between the input clock and the output clock is outside a predetermined range, outputs a first anomaly signal,
    wherein the comparison circuit is constituted as a digital circuit, and
    wherein the comparison circuit counts the number of pulses of the output clock in a reference time corresponding to m-multiplied cycle (m is a natural number) of the input clock and determines whether the frequency difference is outside the predetermined range on the basis of the count value.

2. The jitter detection circuit according to claim 1, wherein the count value is expressed by using a plurality of bits; and
    the comparison circuit performs the determination based on only some of the bits of the plurality of bits.

3. The jitter detection circuit according to claim 1, wherein the comparison circuit comprises a counter that counts the number of pulses of the output clock; and
    the counter resets the count value when the input clock is inputted directly or via a divider.

4. The jitter detection circuit according to claim 3, wherein the comparison circuit outputs a second anomaly signal when the count number of the counter is equal to or more than a predetermined value without resetting the count value.

5. The jitter detection circuit of a phase locked loop circuit according to claim 4, wherein the comparison circuit outputs a third anomaly signal when the count value has not changed once in the reference time.

6. The jitter detection circuit of a phase locked loop circuit according to claim 1, wherein the comparison circuit outputs a third anomaly signal when the count value has not changed once in the reference time.

7. The jitter detection circuit of a phase locked loop circuit comprising:
    a comparison circuit that compares an input clock that is inputted to the phase locked loop circuit and an output clock that is outputted by the phase locked loop circuit and which, when the frequency difference between the input clock and the output clock is outside a predetermined range, outputs a first anomaly signal,
    wherein the comparison circuit is constituted as a digital circuit; and
    a switching circuit which receives a plurality of clocks including the output clock and outputs any one clock among the plurality of clocks,
    wherein the switching circuit selects and, outputs a clock excluding the output clock when the first anomaly signal is outputted by the comparison circuit.

8. The jitter detection circuit of a phase locked loop circuit according to claim 7, comprising:
    a divider circuit that multiplies the cycle of the input clock by m (m is a natural number);
    a counter which inputs the input clock multiplied by m that is outputted by the divider circuit and the output clock and counts the number of pulses of the output clock in a reference time that is determined based on the input clock multiplied by m; and
    a comparator that determines whether the frequency difference is outside the predetermined range on the basis of the count value of the counter.

* * * * *